United States Patent
Neukam et al.

(10) Patent No.: US 6,882,526 B2
(45) Date of Patent: Apr. 19, 2005

(54) CONFIGURATION FOR FIXING A SLIDE-IN UNIT IN A CAGE OF A COMPUTER

(75) Inventors: Wilhelm Neukam, Bobingen (DE); Holger Hein, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 6 days.

(21) Appl. No.: 10/397,142

(22) Filed: Mar. 26, 2003

(65) Prior Publication Data

US 2003/0184964 A1 Oct. 2, 2003

(30) Foreign Application Priority Data

Mar. 26, 2002 (DE) ............................................ 102 13 526

(51) Int. Cl.$^7$ ................................................. G06F 1/16
(52) U.S. Cl. ..................................... 361/685; 361/683
(58) Field of Search ................................. 361/683, 685

(56) References Cited

U.S. PATENT DOCUMENTS

| | | | |
|---|---|---|---|
| 5,142,447 A | * | 8/1992 | Cooke et al. ............... 361/685 |
| 5,227,954 A | | 7/1993 | Twigg |
| 5,332,306 A | | 7/1994 | Babb et al. |
| 5,587,889 A | | 12/1996 | Sacherman |
| 6,025,987 A | | 2/2000 | Allirot et al. |
| 6,067,225 A | | 5/2000 | Reznikov et al. |
| 6,304,457 B1 | | 10/2001 | Liu et al. |
| 6,317,329 B1 | * | 11/2001 | Dowdy et al. .............. 361/725 |

FOREIGN PATENT DOCUMENTS

| | | |
|---|---|---|
| DE | 32 47 678 C2 | 7/1984 |
| DE | 35 42 873 A1 | 6/1987 |
| DE | 36 24 883 A1 | 1/1988 |
| EP | 0 834 880 A1 | 4/1998 |
| EP | 0 843 313 A1 | 5/1998 |
| EP | 1 132 025 A1 | 9/2001 |
| FR | 1333572 | 6/1963 |
| GB | 2 290 457 A | 1/1996 |

* cited by examiner

*Primary Examiner*—Yean-Hsi Chang
(74) *Attorney, Agent, or Firm*—Lawrence A. Greenberg; Werner H. Stemer; Ralph E. Locher

(57) ABSTRACT

A configuration for securing a slide-in unit in a cage of a computer by plastic retaining rails that are attached on the side of the slide-in unit and guide rails that are secured at the cage. The retaining rails are insertable into the guide rails and securable at the guide rails by resilient elements and resilient stops.

2 Claims, 3 Drawing Sheets

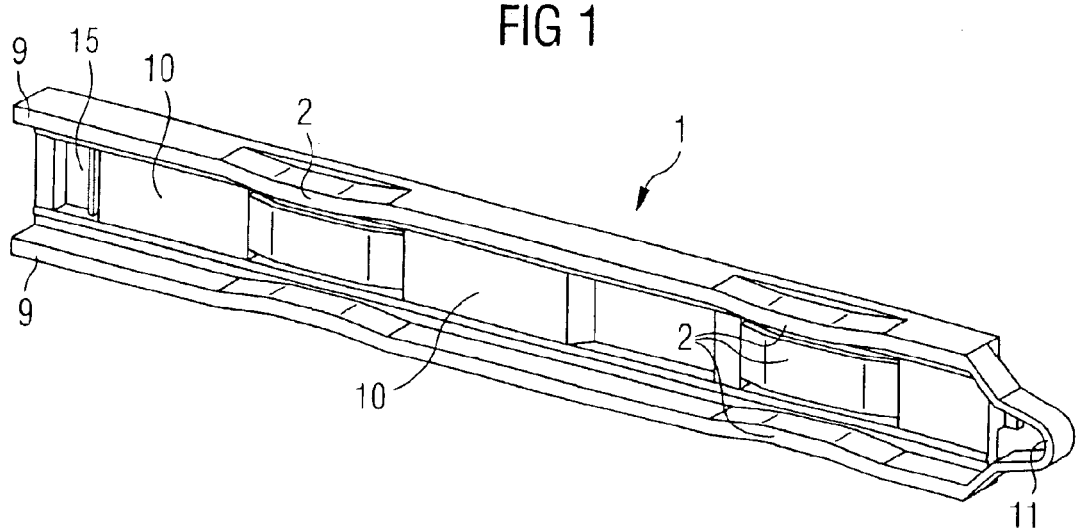
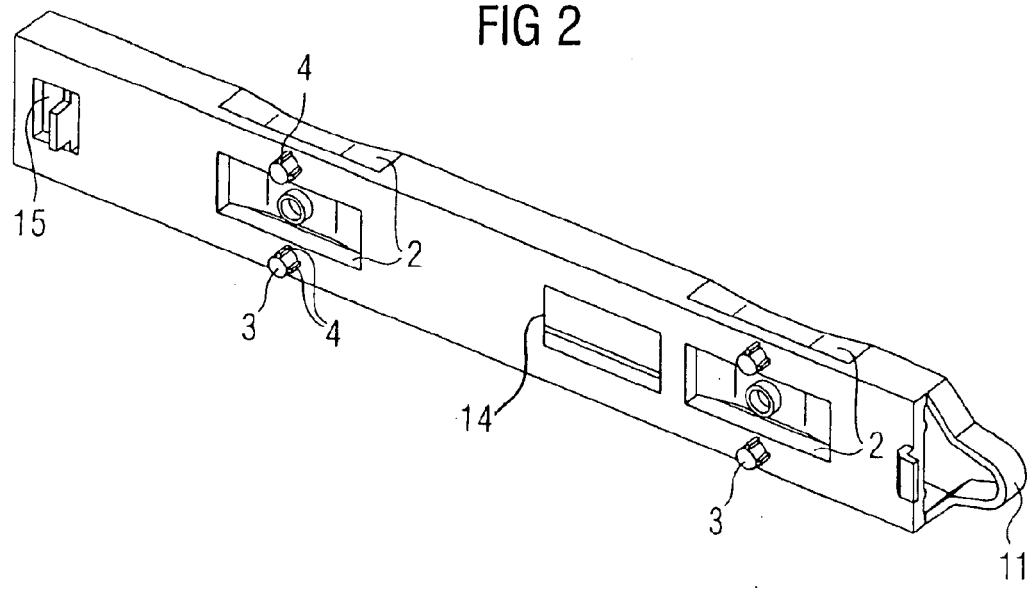

CONFIGURATION FOR FIXING A SLIDE-IN UNIT IN A CAGE OF A COMPUTER

BACKGROUND OF THE INVENTION

Field of the Invention

The invention relates to a configuration for fixing a slide-in unit in a cage of a computer by plastic retaining rails that can be attached at the side of the slide-in unit.

A fixing configuration is known from FIG. 1 of European Patent Application 0 834 880 A1, corresponding to U.S. Pat. No. 6,025,987 to Allirot et al. In the cage, the retaining rails typically rest on flaps that are stamped out of the cage and are bent inward.

A problem with this configuration is that, with a slide-in assembly installed, the configuration has a certain degree of play between the cage and the retaining rails in the vertical, horizontal, and slide-in directions. For that reason, the slide-in unit is not sufficiently secured in the slide-in cage. During the operation of the slide-in assembly, problems arise due to vibrations, and the perfect operation of the slide-in unit is disrupted. Such problems arise primarily in new-generation hard disks with increasingly greater track-densities and higher rotation speeds.

It is expensive and inconvenient for the customer to screw the slide-in unit in at the cage as recommended by the manufacturers of the slide-in units because of the time and tools such action requires. On the other hand, dropped screws can cause problems in the computer such as shorts.

SUMMARY OF THE INVENTION

It is accordingly an object of the invention to provide a configuration for fixing a slide-in unit in a cage of a computer that overcomes the hereinafore-mentioned disadvantages of the heretofore-known devices of this general type and that fixes the retaining rails that are fastened to the slide-in assembly in a cage that prevents vibrations while ensuring easy assembly.

With the foregoing and other objects in view, there is provided, in accordance with the invention, a configuration for securing a slide-in unit in a cage of a computer, including plastic retaining rails to be attached on a side of the slide-in unit and plastic guide rails to be attached to the cage, the retaining rails slidably inserting into the guide rails for securing the slide-in unit in the cage. The invention provides plastic guide rails at the cage into which the retaining rails can be inserted.

The length and width of the guide rails are somewhat larger than those of the retaining rails. A section of the guide rail cut through its long side has a U profile. The center leg hereof corresponds to the width of the retaining rails. The terminal legs of the U are sufficiently short to have the guide rail not touch the slide-in unit when the retaining rail is in the inserted condition.

In accordance with another feature of the invention, there are also provided resilient elements disposed on at least one of the guide rails and the retaining rails. The guide rails can include resilient elements at each of the three legs of the U and at the end of the long side for purposes of centering and fixing the retaining rails. The resilient elements can also be realized on the retaining rail. The configuration of resilient elements makes it possible to optimally absorb vibrations given ideal fixing of the slide-in unit.

In accordance with a further feature of the invention, the resilient elements are adapted to secure the disk drive horizontally and/or vertically.

In accordance with an added feature of the invention, the guide rails have first and second ends, resilient stops are disposed at the first ends, and counterlatches are disposed at the second ends.

In accordance with an additional feature of the invention, there is provided a latching mechanism. The retaining rails are slidably inserted into the guide rails in an insertion direction. The counterlatches of the guide rails, in conjunction with the latching mechanism and the resilient stops of the guide rails, secure the retaining rails in the insertion direction. Preferably, the latching mechanism is disposed on the retaining rails.

In accordance with yet another feature of the invention, the resilient elements and the resilient stops are in one piece or are integral with the guide rails.

In accordance with yet a further feature of the invention, the guide rails and the retaining rails are of different plastics. Absorption is further enhanced by the utilization of plastics with different eigenfrequencies for the retaining rails and the guide rails. That way, the rails dampen one another, which prevents amplification or conduction of the vibrations.

In accordance with yet an added feature of the invention, the guide rails have an outside surface and tabs on the outside surface for attaching the guide rails to the cage in corresponding boreholes of the cage. For a faster and easier assembly of the guide rails at the cage, tabs are provided on the exterior of the guide rails, with which the guide rails can be inserted into corresponding holes in the cage. Corresponding ribs on the tabs are displaced during the insertion process and, thereby, guarantee a seating without play. Preferably, the tabs have ribs on outside surfaces.

In accordance with a concomitant feature of the invention, the guide rails each have a contact window.

Such a configuration makes possible a very simple cage construction because all the mechanisms that are needed for securing are constructed at the plastic rails.

Other features that are considered as characteristic for the invention are set forth in the appended claims.

Although the invention is illustrated and described herein as embodied in a configuration for fixing a slide-in unit in a cage of a computer, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a perspective view of an interior of a guide rail according to the invention;

FIG. 2 is a perspective view of an exterior of the guide rail of FIG. 1;

DESCRIPTION OF THE PREFERRED EMBODIMENTS

Figure 3:
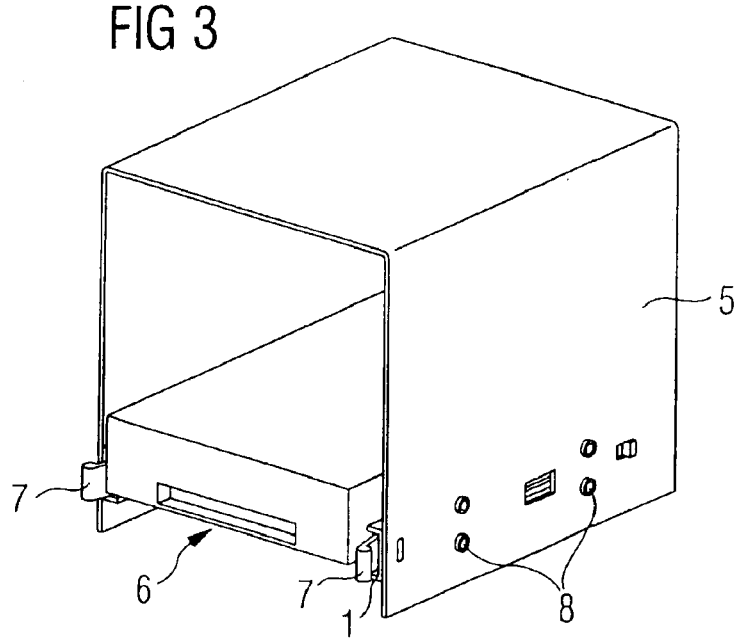
FIG. 3 is a perspective view of a slide-in unit after its insertion into a cage with the aid of guide rails and retaining rails according to the invention.

Referring now to the figures of the drawings in detail and first, particularly to FIG. 1 thereof, there is shown the side of a guide rail 1 into which a retaining rail 7 (see FIGS. 3, 4, 5) can be inserted.

Resilient elements 2, which are built in one piece with the guide rail 1, are located at each leg 9,10 of the guide rail so that the inserted retaining rail 7 is secured horizontally and vertically.

According to a non-illustrated embodiment, the resilient elements 2 are realized at the retaining rail 7. Therefore, the resilient elements 2 are no longer necessary at the guide rail 1 at the positions where resilient elements 2 are provided on the retaining rail 7.

A resilient stop 11 is constructed at one end of the guide rail 1. At the other end, the guide rail 1 includes a counter-latch 15, which works in conjunction with a corresponding latch or latching means 12 at the retaining rail 7. See FIG. 4.

The resilient stop 11, the latch 12, and the counterlatch 15 fix the retaining rail 7 and, with it, a slide-in unit 6, in the direction of insertion.

FIG. 2 illustrates the side of the guide rail 1 that abuts a cage 5 in the inserted condition. See FIG. 3. Tabs 3 are provided on this side, with which the retaining rail 7 can be attached to the cage 5 in corresponding holes 8.

There are longitudinal ribs 4 on the outside surface of the tabs 3, which guarantee a seating of the guide rail 1 in the cage 5 without play. The ribs 4 compensate for imprecisions and are at least partly displaced during insertion into the borehole 8.

FIG. 3 illustrates the cage 5 following the insertion of a slide-in unit 6 by retaining rails 7 and guide rails 1. As can be seen in FIG. 3, the tabs 3 protrude out of the holes 8 to the outside of the cage 5.

Figure 4:
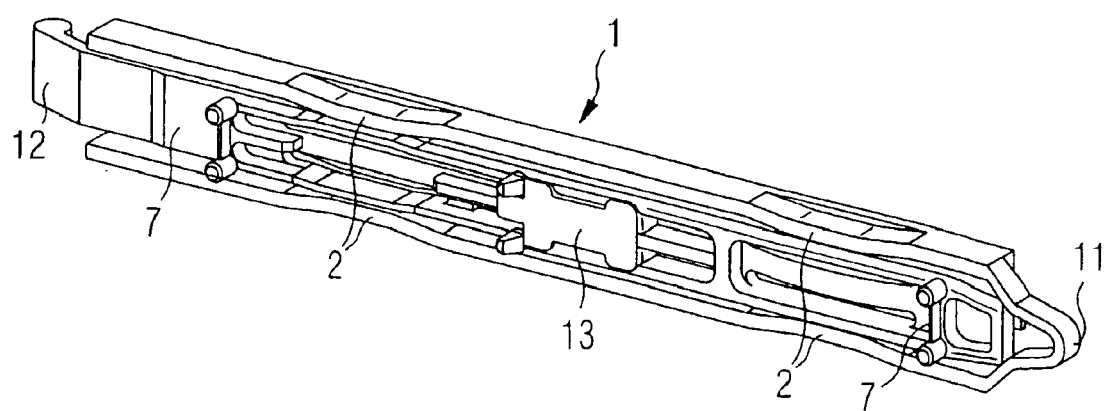
FIG. 4 is a perspective view of the interior of the guide rail of FIG. 1 with a retaining rail according to the invention received therein.

FIG. 4 illustrates the guide rail 1 of FIG. 1 with the retaining rail 7 inserted therein.

The retaining rail 7 is secured by the resilient elements 2, the resilient stop 11, and the interaction of the latch 12 and the counterlatch 15.

There is a contact spring 13 located at the retaining rail 7, which produces conductive contact between the slide-in unit 6 and the cage 5 by way of a contact window 14 (see FIGS. 2 and 5) in the guide rail 1. This grounds the slide-in unit.

Figure 5:
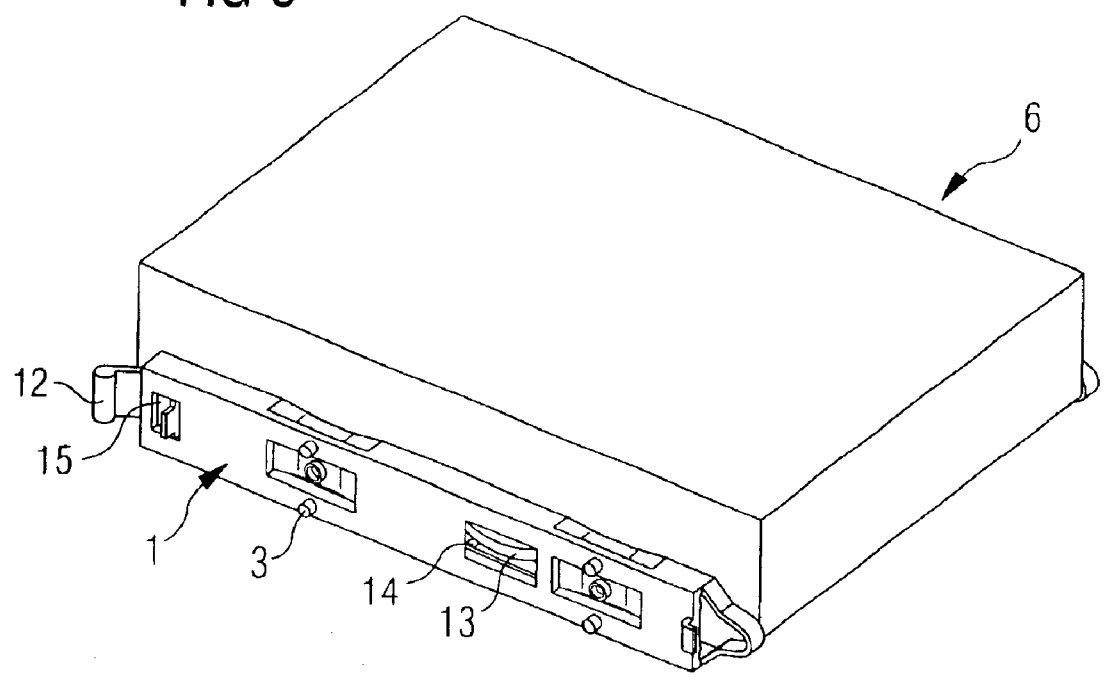
FIG. 5 is a perspective view of a slide-in unit with retaining and guide rails according to the invention attached thereto.

FIG. 5 illustrates the slide-in unit 6 following the attachment of the retaining rail 7 and the insertion of the unit 6 into the guide rail 1. FIG. 5 shows the contact spring 13 protruding from the contact window 14.

We claim:

1. A configuration for securing a slide-in unit having a disk drive in a cage of a computer, the configuration comprising:

plastic guide rails to be attached to the cage, said guide rails having:
   first ends;
   second ends;
   resilient stops disposed at said first ends, said resilient stops being integral with said guide rails; and
   counterlatches disposed at said second ends;

plastic retaining rails to be attached on a side of the slide-in unit, said retaining rails slidably inserting into said guide rails in an insertion direction for securing the slide-in unit in the cage;

plastic resilient elements disposed on said guide rails, said resilient elements being integral with said guide rails and being adapted to secure the disk drive horizontally and vertically; and a latching mechanism in conjunction with said counterlatches and said resilient stops securing said retaining rails in said insertion direction.

2. The configuration according to claim 1, wherein said resilient elements and said guide rail are formed as one piece.

* * * * *